(12) United States Patent
Libove et al.

(10) Patent No.: US 6,452,398 B1
(45) Date of Patent: Sep. 17, 2002

(54) METHOD AND APPARATUS FOR MEASURING D.C. AND A.C. VOLTAGES USING NON-CONTACTING SENSORS

(76) Inventors: Joel Libove, 34 Canyon View Dr., Orinda, CA (US) 94563; Steven Chacko, 21 Murphy Ln., Novato, CA (US) 94945; Jerome Singer, 2917 Avalon Ave., Berkeley, CA (US) 94705

( * ) Notice: Subject to any disclaimer, the term of this patent is extended or adjusted under 35 U.S.C. 154(b) by 0 days.

(21) Appl. No.: 09/707,781

(22) Filed: Nov. 8, 2000

(51) Int. Cl.[7] ............................................. G01R 15/06
(52) U.S. Cl. ........................ 324/457; 324/126; 324/539
(58) Field of Search ............................ 324/126, 117 R, 324/127, 457, 687, 688, 548, 122, 74, 539, 543, 456

(56) References Cited

U.S. PATENT DOCUMENTS

| | | | | |
|---|---|---|---|---|
| 3,818,337 A | * | 6/1974 | Groenenbroom et al. | 324/117 R |
| 4,197,493 A | * | 4/1980 | Juve et al. | 324/457 |
| 4,994,733 A | * | 2/1991 | Yasunaga | 324/115 |
| 5,473,244 A | * | 12/1995 | Libove et al. | 324/126 |
| 5,767,668 A | * | 6/1998 | Durand | 324/117 R |
| 5,959,449 A | * | 9/1999 | Winkler | 324/117 R |

* cited by examiner

*Primary Examiner*—N. Le
*Assistant Examiner*—Vincent Q. Nguyen
(74) *Attorney, Agent, or Firm*—Howard Cohen

(57) ABSTRACT

An apparatus for performing non-contacting measurements of the voltage of a conductor includes a conducting membrane coupled to a transducer. The membrane is driven with an A.C. reference voltage, creating alternating attractive and repulsive electrostatic forces caused by the difference in potential between the membrane and the conductor. The transducer generates a signal having the same frequencies as the forces on the membrane, and the amplitudes of the A.C. components are proportional to the unknown voltage on the conductor. By dividing the amplitude of the A.C. components, an accurate determination of the unknown voltage is calculated A plurality of membranes and transducers may be arrayed to provide an image of multiple voltage readings. In addition, it is also possible to measure A.C. and D.C. voltage on the center conductor of an insulated wire without the need to pierce the insulation.

29 Claims, 4 Drawing Sheets

METHOD AND APPARATUS FOR MEASURING D.C. AND A.C. VOLTAGES USING NON-CONTACTING SENSORS

BACKGROUND OF THE INVENTION

The non-contact measurement of A.C. voltages, by means of measuring the A.C. current caused by capacitive coupling between the unknown wire and a sensing plate, is well established. Most of these methods rely on knowing the capacitance between the wire-under-test and a sensing plate. If this capacitance is not known, the reading will not be accurate, as the current flowing into the sensing plate is proportional to the product of the time derivative of the voltage on the wire and the capacitance between the wire and the sensing plate. One prior invention, U.S. Pat. No. 5,473,244 (Libove and Singer), overcomes the problem of determining the unknown capacitance by dynamically measuring it using an A.C. reference voltage applied to the sensing plate.

Unfortunately, the above measurements are not suitable for non-contact D.C. measurements on a wire, as the derivative of a D.C. voltage is zero, and hence no steady-state current flows into the sensing plate that would allow the measurement device to determine the D.C. voltage on the wire. Conventional methods which do allow non-contacting measurements of D.C. potentials on wires or surfaces generally make use of electrometers, which measure the electrostatic force either between the unknown wire and a charged plate, or between two charged plates that are brought into close proximity to the unknown wire. Such methods are well established, but provide poor accuracy, particularly for low D.C. voltages. Since these methods rely on measuring the mechanical deflection of charged plates, they are sensitive to undesirable error sources such as gravitational effects, temperature effects, D.C. amplifier drift, and susceptibility to low-frequency vibration, making them unsuitable for portable or handheld use. Also, their reading varies with variations in coupling capacitance between the unknown wire and the sensing apparatus. Since this capacitance varies with orientation, wire and sensor geometries, and dielectric constants, the readings are merely proportional to voltage on the unknown wire, rather than conveying an accurate absolute voltage measurement. More importantly, their low sensitivity makes them unsuitable for accurate measurements of voltages below approximately 50 volts D.C., which make up the majority of applications in which D.C. voltage measurement is required, including automotive, aircraft, shipboard, and computer applications. Finally, the size of existing electrometers makes them too large to be used to measure voltages in tight quarters, such as exist in most modern electrical and electronic systems.

The present invention overcomes these problems and results in a system that can accurately measure D.C. and A.C. voltages from the sub-volt level up to many tens of thousands of volts, and provides means for virtually eliminating errors due to capacitance variations, temperature changes, vibration and mechanical orientation between the wire and sensor.

SUMMARY OF THE INVENTION

The present invention provides a method and apparatus for performing non-contacting measurements of the voltage, current and power levels of conductive elements. The voltage measurement system of the present invention consists of a conducting membrane or plate that is fastened to the diaphragm of a microphone or other electromechanical, electronic, or electro-optical transducer. The membrane is brought into proximity with the conductive element (wire or other object) whose unknown voltage is to be measured. The membrane is driven with an A.C. reference voltage and brought near the wire carrying the unknown D.C. voltage, thereby generating an alternating attractive and repulsive force caused by electrostatic attraction between the membrane and the wire with the D.C. voltage. The force applied to the membrane has two basic frequency components, and causes the membrane to move and thereby move the microphone diaphragm to which the membrane is attached. The motion of the microphone diaphragm causes the microphone (or appropriate transducer) to produce an electrical A.C. output voltage containing the same frequency components that the alternating forces contain. This microphone output has two primary frequency components, the first of which is at the same frequency as the reference voltage, and the second of which is at double this frequency. The first component is proportional to the unknown voltage being measured times the known reference voltage times a constant proportional to the coupling capacitance between the wire with the unknown voltage and the membrane. The second component is proportional solely to the known reference voltage squared times the coupling capacitance between the wire and the unknown voltage and the membrane. By dividing the amplitude of the first component by the amplitude of the second component, an accurate determination of the unknown voltage may be made, regardless of changes and uncertainties in the coupling capacitance that may be due to differences in wire geometry, variations in positioning of the wire with respect to the sensing diaphragm, differences in dielectric constant, and other factors which can affect coupling capacitance. Moreover, despite the fact that we are measuring a D.C. voltage, the microphone and all subsequent electronics operate solely with A.C. voltages, eliminating errors due to low frequency vibration, temperature drift, 1/f noise, gravitational effects, and other error sources which plague prior art D.C. voltage measurement apparatus. In addition to measuring the D.C. component of an unknown voltage, the present invention can measure all A.C. components up to one half of the highest frequency to which the microphone or other transducer is capable of responding.

Measurements of voltages on several conductors may be made by duplicating the apparatus described above. The technology of the invention can be expanded to imaging of the voltage on complex electrical structures, through the use of arrays of sensors. In this way, two-dimensional images of the potentials of traces and components on a printed circuit board may be obtained. By combining this novel non-contacting voltage measurement technique with conventional D.C. current measurement apparatus, it is possible to perform fully non-contacting power measurements. Accurate measurements may be made on both insulated and bare conductors, due to the ability to eliminate the effects of differing capacitance values between the conductor and sensing membrane, by means of dividing the amplitude of the first frequency component by that of the second frequency component.

DESCRIPTION OF THE PREFERRED EMBODIMENT

Figure 1:
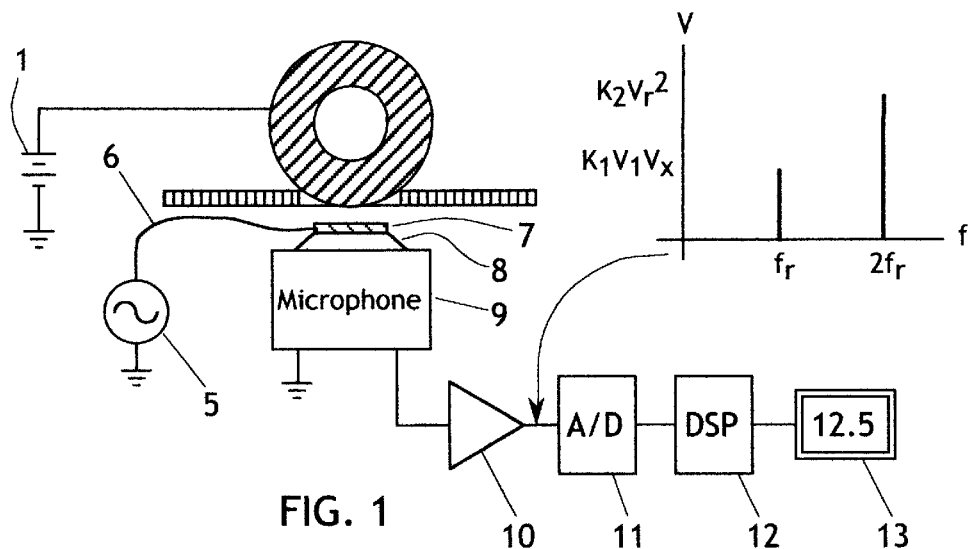
FIG. 1 is a functional block diagram depicting the D.C. voltage measurement apparatus of the invention.

The present invention generally comprises a method and apparatus for non-contact measurement of D.C. voltage in a conductor. The invention provides a sensing plate that is deliberately driven with a known A.C. reference voltage, and detects the A.C. electrostatic force between the sensing plate and the wire whose voltage is to be measured. FIG. 1 shows this basic arrangement. The voltage $V_x$ that is produced by source 1 is present on the center conductor 2 of wire-under-test 3, shown in cross-section. In this example, the wire 3 is insulated, but the invention will work equally well on bare wires. The invention provides a conductive sensing membrane 7 which is deliberately driven via flexible wire 6 with a known A.C. reference signal voltage $V_r$ provided by signal source 5. The wire 3 is supported by a support structure 4 so that it is separated by a small distance, typically a few millimeters, from the membrane 7. The mechanical arrangement in which the center conductor 2 of the wire-under-test 3 is separated from the sensing membrane 7 by a small distance causes a capacitor to be formed between the two, with a capacitance of $C_x$. The voltage $V_c$ appearing across this capacitor is simply the difference in voltage between the wire-under-test and the sensing membrane 7 is therefore given by:

$$V_c = V_x - V_r$$

The energy E stored in any capacitor is given by $E=0.5\ CV^2$, so the energy in the above capacitance between the wire-under-test and the sending membrane is given by:

$$E = 0.5\ C_x(V_x - V_r)^2$$
$$= 0.5\ C_x(V_x^2 - 2V_xV_r + V_r^2)$$

In any capacitor, the force exerted between two plates separated by distance D is given by:

$$F = E/D$$

And therefore for our capacitor, assuming the motion of the membrane is very small compared to the distance D between the wire-under-test and the membrane, the force on the membrane is given by:

$$F = 0.5\ C_x(V_x^2 - 2V_xV_r + V_r^2)/D$$

If we are measuring a D.C. voltage, then $V_x$ is a constant. In the present invention, $V_r$ is applied as either a sinusoid or a complex waveform such as a pulse train. In the simplest case, where $V_r$ is a sinusoid having peak amplitude $V_{r0}$ then $V_r = V_{r0}\sin(\omega t)$, where $\omega$ is the angular frequency of the reference voltage we are applying. Typically $V_{r0}$ will be approximately 100 to 1000 volts, and $\omega$ will be approximately $2\pi$ times a frequency between 500 and 10,000 Hertz.

In the case where $V_r$ is a sinusoid, the force on the sensing membrane may be re-written as, $$F = 0.5\ C_x[V_x^2 - 2V_xV_{r0}\sin(\omega t) + (V_{r0}\sin(\omega t))^2]/D$$

Sensing membrane 7 is mechanically coupled to diaphragm 8 of microphone 9, so that the force F acting on sensing membrane 7 results in a motion of diaphragm 8, which in turn causes an output voltage to be generated by microphone 9. This output voltage is amplified by amplifier 10 and fed into Analog-to-Digital (A/D) converter 11, where the resulting data is made available to Digital Signal Processor 12.

The relationship between force F and microphone output voltage is dependent upon the type of microphone used. For common dynamic microphones, the diaphragm is suspended by a springy support at the edges and, for low frequencies, the deflection x of the diaphragm is given by $x=F/K$, where K is the spring constant of the diaphragm support. At higher frequencies, the deflection is given by a formula which also includes the contribution of the mass of the diaphragm and the damping factor caused by the air surrounding the diaphragm, but for the low audio frequencies we are using in this example, the relationship $x=F/K$ will provide a reasonable approximation for diaphragm motion in response to force. The force equation above may now be rewritten as a deflection equation as follows:

$$x = F/K$$
$$= 0.5\ C_x[V_x^2 - 2V_xV_{r0}\sin(\omega t) + (V_{r0}\sin(\omega t))^2]/DK$$

Also, for a dynamic microphone, the output voltage v is proportional to the derivative of the deflection x, which can be expressed by, $$v = dx/dt$$
$$= 0.5\ C_x[0 - 2V_xV_{r0}\omega\cos(\omega t) + V_{r0}^2 2\omega\cos(2\omega t)]/DK$$

Note that the D.C. component of voltage became zero, due to the differentiating (derivative response) nature of the dynamic microphone. This results in a voltage with two distinct frequency components, the first with an angular frequency of $\omega$ and the second with an angular frequency of $2\omega$. These frequency components can easily be separated from each other by filters or Fast Fourier Transform (FFT) techniques of conventional nature. We can restate the two frequency components $V_\omega$ 14 and $V_{2\omega}$ 15 of the output voltage as follows:

$$V_\omega = -C_xV_xV_{r0}\omega\cos(\omega t)/DK$$
$$V_{2\omega} = C_xV_{r0}^2\omega\cos(2\omega t)/DK$$

Since we know the values of $V_{r0}$ and $\omega$, and have measured v and separated $V_\omega$ and $V_{2\omega}$, we can solve these two equations simultaneously to obtain our unknown voltage $V_x$ which is given by, $$V_x = \frac{V_r|V_\omega|}{2V_{2\omega}}$$

where $|V_\omega|$ and $|V_{2\omega}|$ are the peak absolute values of the frequency-separated components of the microphone output voltage. The operations of separating the frequency components and computing $V_x$ may all be done using DSP 12, and the resulting value of $V_x$ may be displayed on display readout 13, which will typically be a conventional LED or LCD display.

Other types of microphones with different response curves may also be used in place of the dynamic microphone of the example. In fact, microphones with virtually any arbitrary frequency response curve may be used in the invention, as it is relatively simple for the apparatus to automatically measure the response by sweeping the frequency ω over the entire frequency range of interest and measuring changes in the amplitude of $V_{2\omega}$ as the frequency is varied. Indeed, other transducers, such as acoustic or a strain transducers, or other motion detectors, such as electromagnetic, electromechanical, or electro-optical devices, may be employed instead of a microphone. Modern silicon strain transducers are very sensitive, and have the advantage that they are specific to the motion under measurement, whereas microphones may receive more extraneous sounds or vibrations.

Figure 2:
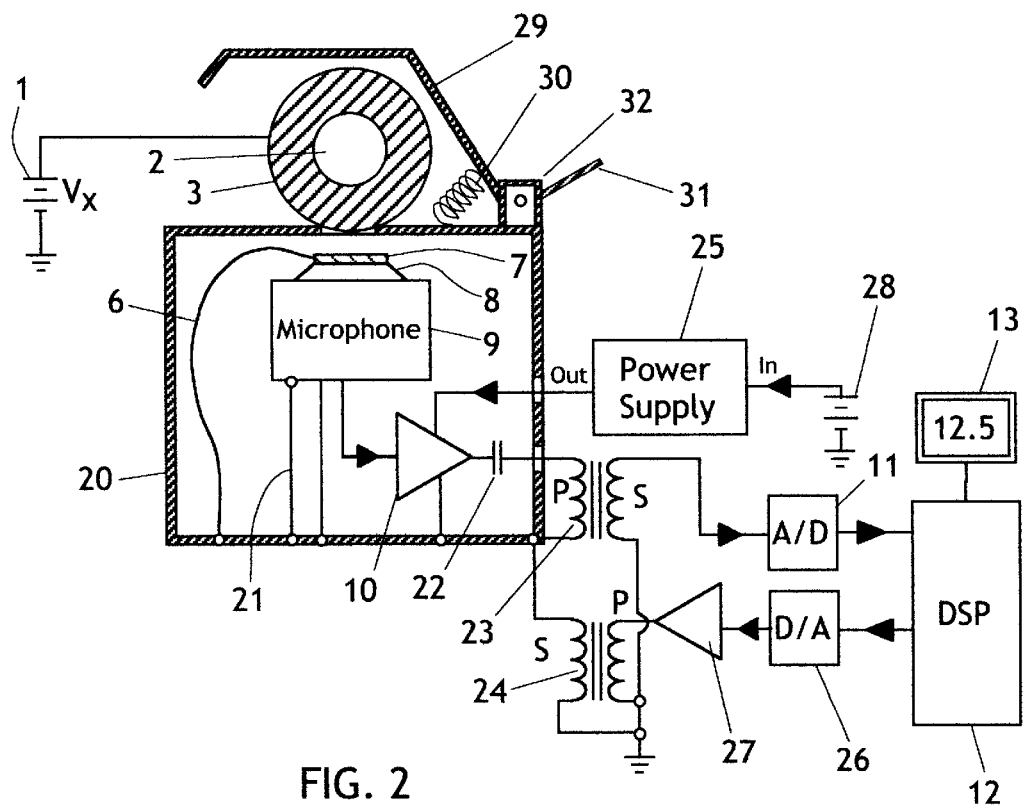
FIG. 2 is a schematic depiction of a preferred embodiment of the invention.

While the simple embodiment of FIG. 1 will successfully detect and measure D.C. and A.C. voltages in a non-contact manner, it may suffer from inaccuracies due to extraneous forces which will exist due to the attraction of the bottom surface of the sensing membrane to the inside of microphone 9, as well as attraction to support structure 4. For this reason, the preferred embodiment depicted in FIG. 2 may have more commercial applications. As with the previous, simpler embodiment, the unknown voltage $V_x$ generated by source 1 that is to be measured is present on the center conductor 2 of wire-under-test 3. However, in this new embodiment, the wire is supported by a shielding support structure 20 that surrounds microphone 9 and amplifier 10, and is driven via a step-up transformer 24, with known A.C. reference signal voltage $V_r$ which is also supplied via flexible wire 6 to conductive sensing membrane 7, and also to the case of microphone 9 via wire 21. Furthermore, shielding support structure 20 is connected to upper shield 29 that causes the wire to be almost surrounded by conductive surfaces that are all driven by reference signal voltage $V_r$. The result is that the entire surroundings of membrane 7 are all at the same potential ($V_r$) as the membrane. Even the internal parts of the microphone, such as its coil are at potential $V_r$, resulting on the complete absence of any stray forces impinging on membrane 7. The only object with a different potential that is exposed to the membrane 7 is the wire-under-test, so all A.C. forces on membrane 7 must come from the wire-under-test. The upper shield 29 is held close to the wire-under-test 3 by spring 30, but may be opened to release the probe from the wire using lever 31 in conjunction with pivot 32.

In order for the coil inside microphone 9 to be at potential $V_r$, the amplifier 10 must also have its ground connection at potential $V_r$, and must have its power supply and output referenced to $V_r$. For this reason, amplifier 10 must be driven by an isolated power supply 25, of conventional design, driven by a D.C. voltage from a power supply (or battery) 28. Also, as $V_r$ may be several hundred volts, the output of amplifier 10 must be isolated from the later A/D converter 11 by isolation transformer 23 of conventional design. In this way, if the output of the microphone 9 at a particular instant of time is 1 millivolt+$V_r$, and amplifier 10 has a gain of +1000, then its output will be at $V_r$+1000 millivolts. If isolation transformer 23 has a 1:1 turns ratio, then the voltage at its secondary will merely be 1000 millivolts, which is a voltage within the acceptable range for A/D converter 11. Hence, despite the fact that the entire microphone, amplifier, and external shield is at high voltage $V_r$, the A/D will only see a magnified version of the actual voltage generated by the microphone's coil.

As with the prior embodiment, the operations of separating the frequency components and computing $V_x$ may all be done using DSP 12, and the resulting value of $V_x$ may be displayed on display readout 13. In this preferred embodiment, DSP 12 also drives a digital-to-analog (D/A) converter 26, which then drives power amplifier 27, which in turn drives step-up-transformer 24 which generates $V_r$.

Figure 3:
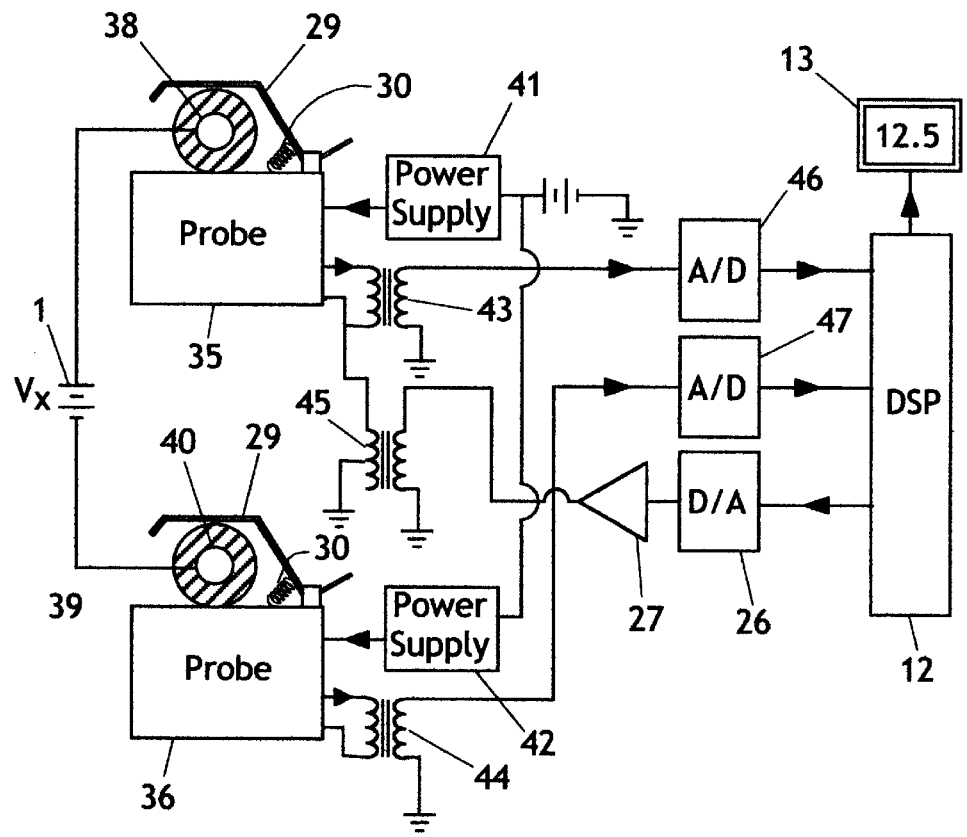
FIG. 3 is a schematic view of an embodiment of the invention for measuring the potential difference between two insulated wires.

In many applications, such as most automotive and aircraft uses, a single non-contact probe, such as described in the preferred embodiment above, is sufficient, since many D.C. voltages are measured with respect to a common ground, such as the chassis of the vehicle or aircraft. As this ground is normally a conductor, the ground may be accessed by the meter by merely clipping a standard alligator clip to it. However, in some applications, no bare-metal ground is available, and it is necessary to have two separate non-contacting probes, so as to measure the potential difference between two insulated wires. FIG. 3 illustrates how two probes similar to that of the preferred embodiment above may be combined in a single instrument.

In FIG. 3, as before, we desire to measure an unknown voltage $V_x$. However, in this two probe implementation, $V_x$ is applied between the two center conductors 38 and 40 of insulated wires 37 and 39 respectively. Each of these wires is clamped in contact with enclosed probes 35 and 36, each of which has the same internal components as were contained in shielded enclosure 20 of FIG. 2. In this two-probe implementation, there are two isolated power supplies 41 and 42 in place of the single supply 25 of FIG. 2. Both of these isolated power supplies 41 and 42 are driven by a D.C. voltage from a power supply (or battery) 28, described previously. While the single-probe embodiment of FIG. 2 employs a simple step-up transformer 23, the double probe embodiment of FIG. 3 ideally should employ a center-tapped step-up transformer 45, which will generate two A.C. reference voltages $V_r$ and $-V_r$, that are 180 degrees out of phase. In this way, assuming the capacitive coupling between each probe and its surrounds are roughly equal, no net A.C. voltage will exist between the main meter electronics and its surrounding ground. In this way, there will normally be no need to provide any ground to the main meter electronics, allowing convenient operation as a portable or hand-held instrument.

In this two-probe embodiment, there are two A/D converters 46 and 47 whose outputs are fed to DSP 12. Alternatively, a single A/D converter with a 2:1 input multiplexer may be used. The DSP 12 computes the voltage seen by each probe, as with the single probe embodiment. However, as a final computation, DSP 12 subtracts the two voltages, to yield the final result, representing the potential difference between the two wires-under-test 37 and 39.

Figure 4:
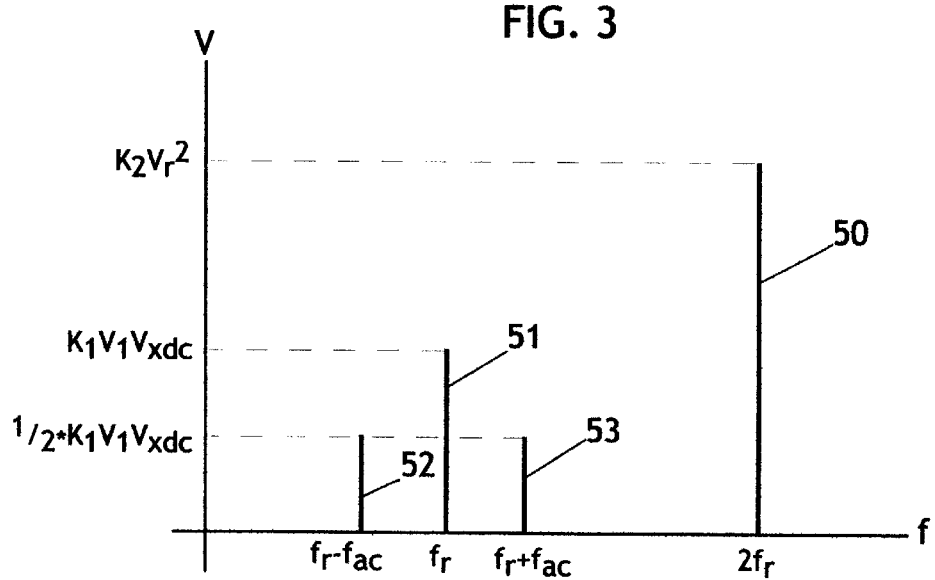
FIG. 4 is a graph of voltage versus frequency that illustrates the expected frequency spectrum of the microphone output in response to the measured voltage $V_x$ containing both D.C. and A.C. components.

As mentioned earlier, the present invention is usable for both D.C. and A.C. measurements. FIG. 4 illustrates the frequency spectrum of the microphone output that would result if $V_x$ is composed of both a D.C. component $V_{xdc}$ and an A.C. component $V_{xac}$, which has frequency $f_{xac}$. To accurately measure a.c voltages having bandwidth of $f_b$, it is merely necessary to use a filter after amplifier 10 which passes all frequencies between fr−fb and fr+fb, and multiplying the resulting filter output voltage by $V_r/(2|v_{2\omega}|)$, just as we did for $v_\omega$ when we were measuring a D.C. voltage.

In fact, the display is not limited to a single measurement displayed on a simple LCD or LED numerical readout. The information from this invention can also be in the form of a continuous stream of voltage readings, which can be used to generate an oscilloscope-type waveform display, or a spectral plot, showing the frequency components of the unknown voltage, displayed in the same format as used in conventional spectrum analyzers.

Figure 5:
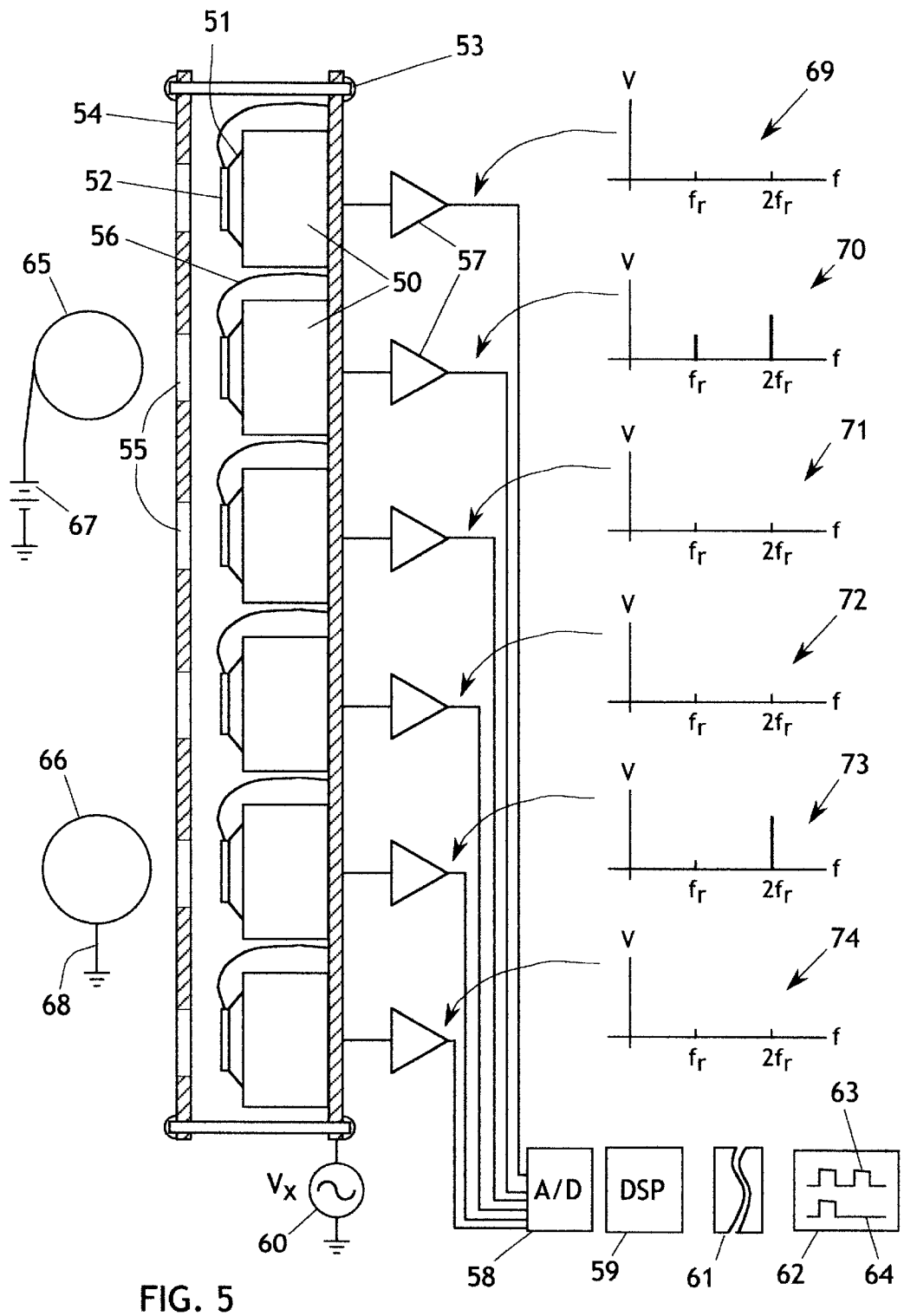
FIG. 5 is a functional block diagram showing a linear array of sensors used for imaging position and voltage on conductors.

The fact that the invention causes the microphone to generate an output signal having a component at angular frequency 2ω, even when there is no voltage $V_x$ on the wire being measured, allows the invention to detect the existence of wires or other conductors even if they have no voltage on them. This feature makes the invention useful for doing one and two-dimensional images of conductors, or groups of conductive objects, such as the components and traces on a printed circuit (PC) board. Hence, both location and voltage may be independently imaged. FIG. 5 is a simplified diagram showing how a linear array of microphones may be used to make a 1-dimensional image of the position and voltage on more than one conductor. In FIG. 5 an array of microphones 50, each with a diaphragm 51 and sensing membrane 52 are mounted on a conductive rear surface 53 and enclosed behind a conductive front surface 54, with holes 55 each disposed adjacent to a respective membrane 52. The sensing membranes 52 are connected to the conductive rear surface 53 via flexible wires 56. The output of microphones 50 are fed to amplifiers 57, which feed a multi-channel A/D converter 58 whose data is fed to DSP 59. The entire group of components 50 through 59 are all driven by reference voltage source 60 which is an A.C. source having amplitude $V_r$. This reference has the same purpose as it had in the single probe of the preferred embodiment, except that now all microphones, amplifiers, shielding components, A/D and DSP are all riding on this large reference signal. In order to isolate this large signal from the display system 62, a digital isolation system 61 of conventional design is used. This entire system that is driven with reference $V_r$ is placed in proximity to the conductors 65 and 66 that we are trying to measure in this example. The number of microphones and number of unknown conductors being measured may be scaled up considerably from the present example. In our example, the top conductor 65 is driven to a voltage Vx by source 67, while the bottom conductor 66 is not driven, and is instead connected to ground 68. Frequency plots 69 through 74 display the amplified microphone outputs for each of the six microphones in the example. Plot 69 shows the frequency spectrum of the top microphone, which is not located near either of the two wires being measured, and hence produces essentially no signal, either at ω or 2ω. Plot 70 shows the frequency spectrum of the second microphone from the top, which is located near the wire being measured that is driven by voltage Vx, and hence this microphone produces signals at ω due to the fact that Vx is a D.C. voltage and 2ω, due to the fact that there is a capacitance between the wire and the sensing membrane 52 on the microphone. Plot 71 and 72 show the frequency spectrum of the microphones that are third and forth from the top, which are not located near either of the two wires being measured, and hence produce essentially no signal, either at ω or 2ω. Plot 73 shows the frequency spectrum of the fifth microphone from the top, which is located near the wire being measured that is driven by no voltage, and hence this microphone produces no signal at ω, due to the fact that Vx is zero, but does produce a signal at frequency 2ω, due to the fact that there is a capacitance between the wire and the sensing membrane 52 on the microphone. In this way we see that the invention measures not only voltage on an energized wire (and also capacitance between the wire and the sensing membrane), but also capacitance between the sensing membrane and an un-energized wire. Finally, plot 69 shows the frequency spectrum of the bottom microphone, which is not located near either of the two wires being measured, and hence produces essentially no signal, either at ω or 2ω.

If the outputs of the six amplified microphones are plotted on two plots, the first depicting the amplitude of the ω component of each and the second depicting the amplitude of the 2ω component, both as a function of microphone position, we obtain 1-dimensional display plots of capacitance to the two conductors (representative of conductor location) and voltage on the two conductors. The display 62 is capable of displaying these two plots, the first 63 being a graph of conductor location and the second 64 being a graph of voltage as a function of position.

Figure 6:
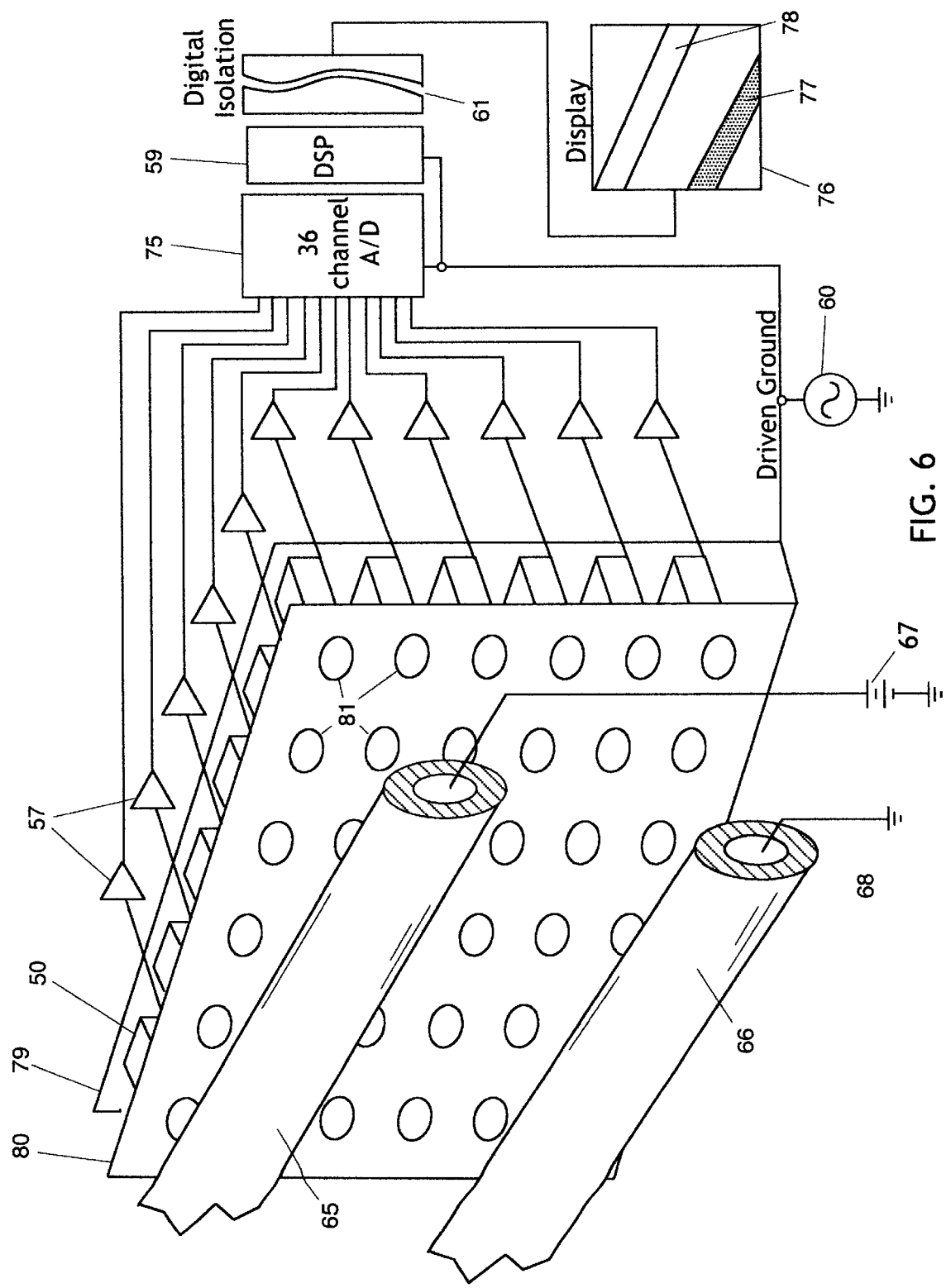
FIG. 6 is a perspective view showing a two dimensional array of sensors for imaging conductor position and voltage.

The voltage imaging capability of the present invention can also be expanded to two dimensions, by using a square or rectangular array of microphones, as shown in FIG. 6. In FIG. 6 a 6×6 array of microphones 50, each with a diaphragm 51 and sensing membrane 52 (as in FIG. 5) are mounted to a conductive rear surface 79 and enclosed behind a conductive front surface 80 with holes 81. The sensing membranes 52 are connected to the conductive rear surface 79 or front surface 80 via flexible wires 56 (as in FIG. 5). The output of microphones 50 are fed to amplifiers 57, which feed a 36-channel A/D converter 75 whose data is fed to DSP 59. The entire group of aforementioned components are all driven by reference voltage source 60 which is an A.C. source having amplitude $V_r$. This reference has the same purpose as it had in the single probe of the preferred embodiment and the linear array embodiment of FIG. 5. In order to isolate this large signal from the display system 76, a digital isolation system 61 of conventional design is used. This entire system that is driven with reference $V_r$ is placed in proximity to the conductors 65 and 66 that we are trying to image in this example. In our example, the top conductor 65 is driven to a voltage Vx by source 67, while the bottom conductor 66 is not driven, and is instead connected to ground 68.

If the outputs of the thirty-six amplified microphones are plotted on a 6 by 6 element two-dimensional plot, with the intensity at a given x-y location on the display depicting the amplitude of the ω component of the microphone in the corresponding x-y position, and the color at each x-y location on the display depicting the amplitude of the 2ω component of the microphone at the corresponding x-y position we obtain a 2-dimensional display plot of capacitance of the array of microphones to the two conductors (representative of conductor location) and also of the respective voltage on the two conductors as a function of position. The display 76 is capable of displaying the position and voltage on the two wires, the first 77 being a picture of the location and voltage of energized conductor 65 and the second 78 being a picture of the un-energized wire 66. It will be obvious to those skilled in the art that the number of microphones and number of unknown conductors being measured may be scaled up considerably from the present example, enabling the imaging of hundreds or even thousands of points, both for existence of a conductor or even a non-conducting dielectric, and for potential as a function of x-y position. Such an embodiment of the invention could, if adequately miniaturized, be used to image components or traces on a p.c. board. The present invention could, if scaled accordingly, be used as the basis for a type of "night-vision" system in which conductive, dielectric, or charged objects could be imaged from a short to moderate distance.

The individual microphones of the examples shown may be replaced with other transducers, such as accelerometers mounted on a compliant surface or piezoelectric or electret bulk sheets onto which microphone electrodes may be etched, followed by gluing on a sheet of sensing membranes. The entire assembly would then be energized by voltage $V_r$, potentially producing thousands of points of measurement of proximity to, and potential of, nearby conductors.

What is claimed is:

1. A device for measuring an unknown voltage on an object, including:
   a membrane disposed in close proximity to the object;
   means for driving said membrane with an A.C. reference voltage, said reference voltage causing an alternating electrostatic force to be applied between said membrane and the object,
   force transducer means for converting said alternating electrostatic force to a corresponding output signal; and,
   means for scaling said output signal to represent the unknown voltage on the object.

2. The device of claim 1, wherein said membrane is electrically conductive.

3. The device of claim 1, wherein said force transducer means includes a microphone coupled to said membrane.

4. The device of claim 1, wherein said force transducer means includes a strain transducer.

5. The device of claim 1, wherein said force transducer means includes an accelerometer.

6. The device of claim 1, wherein said force transducer means includes an electromagnetic device.

7. The device of claim 1, wherein said force transducer means includes an electromechanical device.

8. The device of claim 1, wherein said force transducer means includes an electro-optical device.

9. The device of claim 1, wherein said force transducer means includes a piezoelectric device.

10. The device of claim 1, wherein the unknown voltage on the object includes an AC component at frequency $f_{ac}$, and said output signal includes a component $V_\omega$ at the frequency $f_r$ of said AC reference signal, a component $V_{2\omega}$ at twice the frequency of said AC reference signal, and components at frequencies $f_r \pm f_{ac}$.

11. The device of claim 10, wherein said means for scaling said output signal includes means for multiplying said frequencies $f_r \pm f_{ac}$ by $V_r/(2|v_{2\omega}|)$ to yield the measured voltage of said AC component of the unknown voltage on the object.

12. The device of claim 1, wherein said unknown voltage comprises a D.C. voltage, and said object comprises a conductive wire.

13. The device of claim 12, further including housing means for substantially enclosing a portion of the conductive wire, said housing, membrane, and transducer all being driven by said AC reference signal.

14. The device of claim 1, wherein the output signal of said force transducer is separated into frequency components by said means for scaling, and further including means for displaying the spectral component of the output signal which is at twice the frequency of the applied AC reference voltage, said spectral component being indicative of the approximate capacitive coupling between the object whose voltage is to be measured and said membrane.

15. The device of claim 14, wherein all frequency components of the output signal other than said spectral component are proportional to the approximate total unknown voltage on the object whose voltage is to be measured.

16. The device of claim 14, wherein the frequency components of said output signal other than said spectral component are all divided by said spectral component, the resulting dividend being approximately proportional to the actual A.C. or D.C. voltage on the wire whose voltage is to be measured.

17. The device of claim 1, wherein the unknown voltage on the object is a D.C. voltage, and said output signal includes a frequency component $V_\omega$ at the frequency of said AC. reference signal and a frequency component $V_{2\omega}$ at twice the frequency of said AC. reference signal.

18. The device of claim 17, wherein said means for scaling said output signal includes digital signal processing means for isolating said $V_\omega$ and said $V_{2\omega}$ components.

19. The device of claim 18, wherein said digital signal processing means includes means for calculating the ratio of $V_\omega$ divided by $V_{2\omega}$, said ratio being proportional to the voltage on the object.

20. The device of claim 18, wherein said digital signal processing means includes means for calculating the ratio of the peak absolute value of $V_\omega$ divided by the peak absolute value of $V_{2\omega}$, said ratio being proportional to the voltage on the object.

21. The device of claim 20, further including means for displaying said ratio as the voltage on the object.

22. The device of claim 1, further including a plurality of said membranes, and a plurality of said transducers, each transducer coupled to a respective one of said membranes to produce a respective output signal, said means for scaling operating on each of said respective output signals to generate multiple voltage readings.

23. The device of claim 22, wherein said plurality of membranes are disposed in a regular array to generate an array of voltage readings.

24. The device of claim 23, further including display means for forming an image comprised of said array of voltage readings.

25. The device of claim 24, wherein said array comprises a two-dimensional array, and said image comprises a two-dimensional image.

26. The device of claim 22, wherein said plurality of membranes includes a pair of membranes, each disposed adjacent to a separate conductor, and means for measuring the potential difference between the separate conductors.

27. The device of claim 26, further including a center-tapped transformer connected to deliver said A.C. reference voltage to said pair of membranes in 180° out of phase relationship.

28. The device of claim 27, wherein said means for scaling includes means for determining the voltage on the separate conductors, and means for subtracting the voltage on the separate conductors to yield the potential difference between the separate conductors.

29. A device for imaging the existence and distribution of conductive and non-conductive objects, including:
   a plurality of membranes disposed in a regular array;
   means for driving said plurality of membranes with an A.C. reference voltage, said reference voltage causing a respective alternating electrostatic force to be applied between each of said membranes and the objects;
   force transducer means for converting said respective alternating electrostatic forces to corresponding output voltages;
   means for scaling said output voltages to represent the voltage and conductivity of the respective objects; and,
   display means for forming an image comprised of said array of voltage and conductivity readings.

* * * * *